(12) United States Patent
Takata

(10) Patent No.: US 8,446,105 B2
(45) Date of Patent: May 21, 2013

(54) DISPLAY APPARATUS

(75) Inventor: Kenji Takata, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 96 days.

(21) Appl. No.: 13/105,784

(22) Filed: May 11, 2011

(65) Prior Publication Data

US 2011/0278604 A1    Nov. 17, 2011

(30) Foreign Application Priority Data

May 17, 2010 (JP) ................. 2010-113433

(51) Int. Cl.
- G05F 1/00 (2006.01)
- H05B 37/02 (2006.01)
- H05B 39/04 (2006.01)
- H05B 41/36 (2006.01)

(52) U.S. Cl.
USPC ......................................... 315/294

(58) Field of Classification Search .......... 257/89, 257/E21.121; 345/77, 690; 315/294
See application file for complete search history.

(56) References Cited

U.S. PATENT DOCUMENTS

| | | | | |
|---|---|---|---|---|
| 7,009,343 B2 * | 3/2006 | Lim et al. | | 315/150 |
| 8,004,479 B2 * | 8/2011 | White et al. | | 345/76 |
| 2005/0017991 A1 * | 1/2005 | Yamazaki et al. | | 345/690 |
| 2005/0168490 A1 * | 8/2005 | Takahara | | 345/690 |
| 2008/0129223 A1 * | 6/2008 | Choi | | 315/297 |
| 2009/0021534 A1 * | 1/2009 | Tomizawa et al. | | 345/690 |
| 2009/0268127 A1 * | 10/2009 | Tanaka et al. | | 349/62 |
| 2009/0284175 A1 * | 11/2009 | Park et al. | | 315/294 |
| 2010/0171440 A1 * | 7/2010 | Satou et al. | | 315/294 |
| 2010/0171441 A1 * | 7/2010 | Schlangen et al. | | 315/294 |
| 2010/0219770 A1 * | 9/2010 | Kim et al. | | 315/294 |
| 2010/0264842 A1 * | 10/2010 | Shimizu et al. | | 315/287 |
| 2011/0298387 A1 * | 12/2011 | Kaneda et al. | | 315/250 |
| 2012/0056556 A1 * | 3/2012 | Laski et al. | | 315/294 |
| 2012/0194082 A1 * | 8/2012 | Huang et al. | | 315/152 |
| 2012/0326627 A1 * | 12/2012 | McDaniel, Jr. | | 315/294 |
| 2013/0049632 A1 * | 2/2013 | Kim | | 315/294 |

FOREIGN PATENT DOCUMENTS

JP    2005-037847 A    2/2005

* cited by examiner

*Primary Examiner* — Jae Lee
*Assistant Examiner* — Grant Withers
(74) *Attorney, Agent, or Firm* — Canon U.S.A. Inc., IP Division

(57) ABSTRACT

A display apparatus displays a character or a graphic formed by a first light-emitting element group (first group) and a background of the character or the graphic formed by a second light-emitting element group (second group) on a display unit. The ratio of the electric current flowing through the light-emitting elements (elements) in the second group to the elements in the first group with respect to the elements of a same color as the elements whose electric current per unit light-emitting area is the largest among the elements of different colors when the display unit displays white, is closer to 1 than the ratio of the electric current flowing through each of the elements in the second group to the elements in the first group with respect to the elements of different colors from the elements whose electric current per unit light-emitting area is the largest when the display unit displays white.

5 Claims, 9 Drawing Sheets

DATE AND TIME  '06/11/03  09:30

PICTURE STYLE    STANDARD

COLOR SPACE     sRGB

WHITE BALANCE   AUTOMATIC

CAMERA SETTING  AUTOMATIC

22

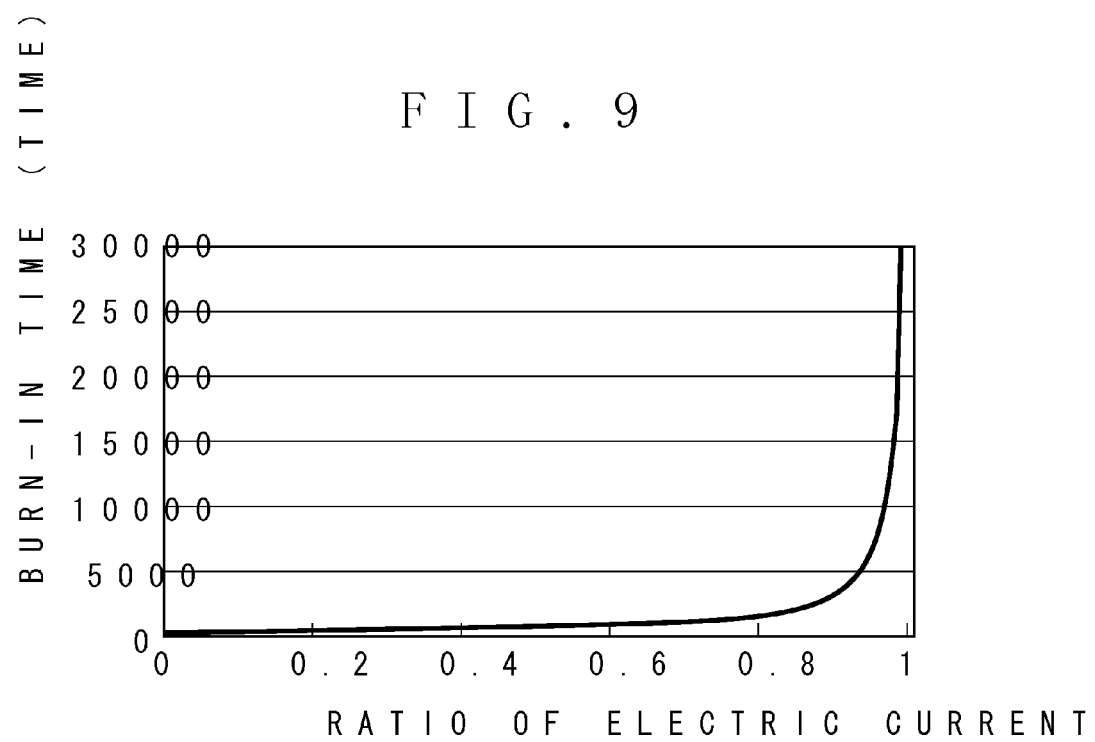

DISPLAY APPARATUS

BACKGROUND OF THE INVENTION

1. Field of the Invention

The present invention relates to a display apparatus, and more particularly, the present invention relates to an organic electroluminescence (hereinafter, abbreviated to EL) display apparatus.

2. Description of the Related Art

Display apparatuses that use emission of light of organic EL elements, especially, active-matrix organic EL display apparatuses that are controlled using a thin-film transistor (hereinafter, abbreviated to TFT) have advantages as compared to liquid crystal displays, for example, the organic EL display apparatuses can vividly display images and the apparatuses can be thinly made, and thereby have attracted attention.

However, there is a problem that the luminance of the organic EL elements decreases after long-time emission of light. FIG. 2 illustrates change of the luminance of organic EL elements to which a certain amount of electric current is applied to emit light continuously. The vertical axis indicates the rate of decrease from initial luminance, and the horizontal axis indicates elapsed time (unit: time). In the figure, the three curves indicate initial luminance of 100 cd/m$^2$, 300 cd/m$^2$ and 500 cd/m$^2$ respectively. The magnitude of the electric current flowing through the elements is great in this order. As illustrated in the figure, as the initial luminance is higher, in other words, as the magnitude of the electric current is greater, the degradation of the luminance is faster.

The reason for the degradation of the luminance has not yet been fully understood. Given the fact that the light-emitting face has not reduced, it is thought that the degradation is not due to an external factor, but due to change of the inside of the organic EL elements generated along with the emission of light. The speed of the degradation of the luminance depends on the magnitude of the electric current per unit area of the light-emitting face, in other words, the current density, so that if the current density is high, the degradation of the luminance proceeds fast.

In a matrix display apparatus, when a certain white pattern is displayed with a black background, and the display is repeatedly performed for long periods of time, organic EL elements in the black part are in a light-off state, so that the luminous efficiency of the organic EL elements in the black part does not degrade. On the contrary, the luminous efficiency of the organic EL elements in the white pattern part degrades. As a result, when another image is displayed, a luminance difference between the area where the white pattern has been displayed and the area where the black background has been displayed is generated. When the luminance difference becomes visible to human eyes, the luminance difference is recognized as burn-in of the pattern. The burn-in is a phenomenon that a part of a previous screen can be seen as an image lag when the screen is switched. The burn-in significantly deteriorates the image quality.

In digital cameras, information such as an operation mode of the camera is displayed on a liquid crystal or an organic EL monitor display. The information is displayed at the same position on the monitor screen as a certain pattern such as an icon, thereby burn-in is generated.

Japanese Patent Application Laid-Open No. 2005-037847 discusses means for reducing burn-in in digital cameras. In the method, when a white icon is displayed, a white balance is changed, and within a range the user can recognize the icon image as a white image, the luminance of a most deteriorating color is decreased to the luminance lower than that of the other colors.

Monitor displays of portable apparatuses such as digital cameras that are often used outdoors are required to maintain sufficient viewability even under bright external light. However, in order to prevent burn-in, if the luminance of the pattern itself for displaying characters or an icon is lowered, the displayed pattern is hard to see because, for example, in the outdoors where the intensity of external light is high, the ratio of reflected light increases.

SUMMARY OF THE INVENTION

According to aspects of the present invention, even under environments such as outdoors where there is a lot of reflected light, while viewability of a display screen is ensured, it is possible to make the burn-in due to luminance degradation difficult to see.

According to an aspect of the present invention, a display apparatus including a display unit in which a plurality of light-emitting elements that emit light at luminance corresponding to flowing electric current are arranged is provided. The plurality of light-emitting elements include light-emitting elements of different colors from each other which display white when each of the light-emitting elements of the different colors emits light at the maximum luminance. The plurality of light-emitting elements includes a first light-emitting element group including the light-emitting elements of the different colors from each other, and forming a character or a graphic arranged in a certain position in the display unit, and a second light-emitting element group including the light-emitting elements of the different colors from each other same as the first light-emitting element group and forming a background of the character or the graphic arranged in a position surrounding the first light-emitting element group. When the character or the graphic and the background are displayed on the display unit, the ratio of the electric current flowing through the light-emitting elements of the second light-emitting element group to the electric current flowing through the light-emitting elements of the first light-emitting element group with respect to the light-emitting elements of a color among the light-emitting elements of the different colors whose electric current per unit light-emitting area is the largest when the light-emitting elements of the different colors display white, is closer to 1 than the ratio of the electric current flowing through each of the light-emitting elements of the second light-emitting element group to the electric current flowing through the light-emitting elements of the first light-emitting element group with respect to the light-emitting elements of the other colors among the light-emitting elements of the different colors.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 3 illustrates a monitor screen of a digital camera in which a display apparatus according to a first exemplary embodiment of the present invention is used.

FIG. 9 illustrates a relationship between the ratio of the electric current in a character area and a background area and burn-in time.

DESCRIPTION OF THE EMBODIMENTS

Various exemplary embodiments, features, and aspects of the invention will be described in detail below with reference to the drawings.

Figure 1A:
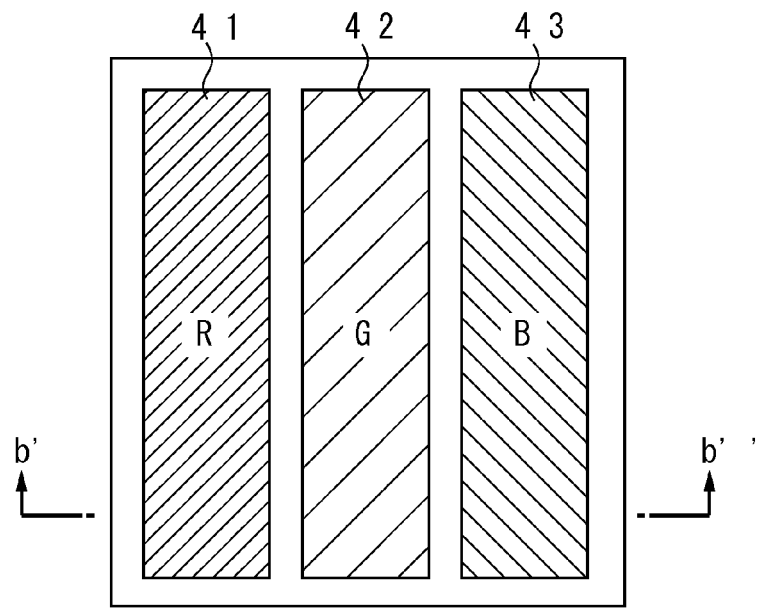
FIG. 1A illustrates a pixel in a display apparatus according to an exemplary embodiment of the present invention.
Figure 1B:
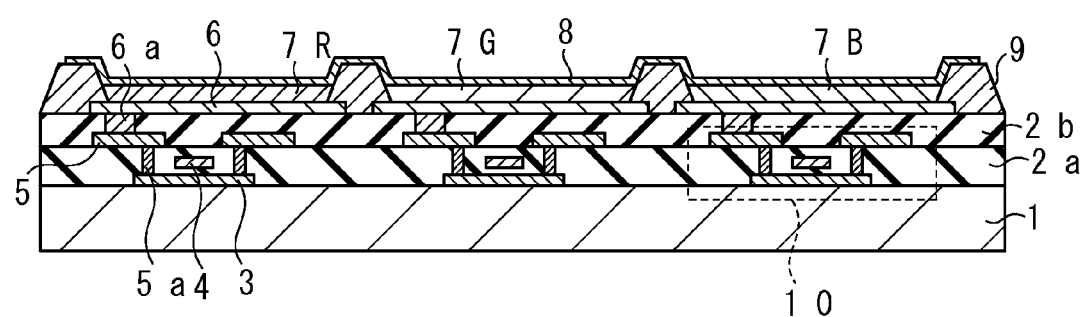
FIG. 1B illustrates a cross-section of the pixel.

FIGS. 1A and 1B illustrate the pixel in the display apparatus according to the exemplary embodiment of the present invention and the cross-section of the pixel.

The organic EL element display apparatus according to the exemplary embodiment of the present invention includes a plurality of respective pieces of organic EL elements of three colors of red (R) 41, green (G) 42, and blue (B) 43. The organic EL elements are arranged in a matrix state and configure a display unit. The three organic EL elements of R, G, and B configure pixels, and have light-emitting areas indicated by rectangles R, G, and B in FIG. 1A. The organic element emits light at luminance corresponding to an electric current flowing through it. When each of the three organic elements of R, G, and B emits light at the maximum luminance, they display white.

FIG. 1B is a cross-sectional view taken along the dashed-dotted line b'-b" of FIG. 1A. On a substrate 1, a transistor having a semiconductor layer 3 and a gate electrode 4 is formed. The semiconductor layer 3 is connected to source/drain electrodes 5 through contact holes 5a opened in an insulating layer 2a. A part of the source/drain electrodes 5 is connected to an anode 6 of the organic EL element through a contact hole 6a opened in a second insulating layer 2b. The transistor and the source/drain electrodes 5, together with the other transistors and wirings (not shown) formed on the same substrate 1, forms a drive circuit 10 of organic EL elements 41 to 43.

Each of the organic EL elements 41 to 43 includes the anode 6, organic emitting materials 7R, 7G, and 7B, and a cathode 8 respectively, and emits light by electric current flowing between the anode 6 and the cathode 8. The electric current is supplied from the above-described drive circuit 10 connected to the anode 6.

The organic EL elements 41 to 43 emit light in proportion to electric current per unit area of each of the light-emitting faces R, G, and B in FIG. 1A, specifically, luminance $\eta \cdot i$ in proportion to a current density i. In the expression, $\eta$ is a luminous efficiency. Each of the organic EL elements of red, green, and blue emits light in a light-emitting area defined by each aperture ratio a (an area ratio of a light-emitting face to a display face) on the display face. In the conditions, the luminance L of the entire display face is expressed as follows:

$$L = a \cdot \eta \cdot i.$$

In the description, the term simply referred to as "luminance" means the luminance of the entire display face.

Figure 2:
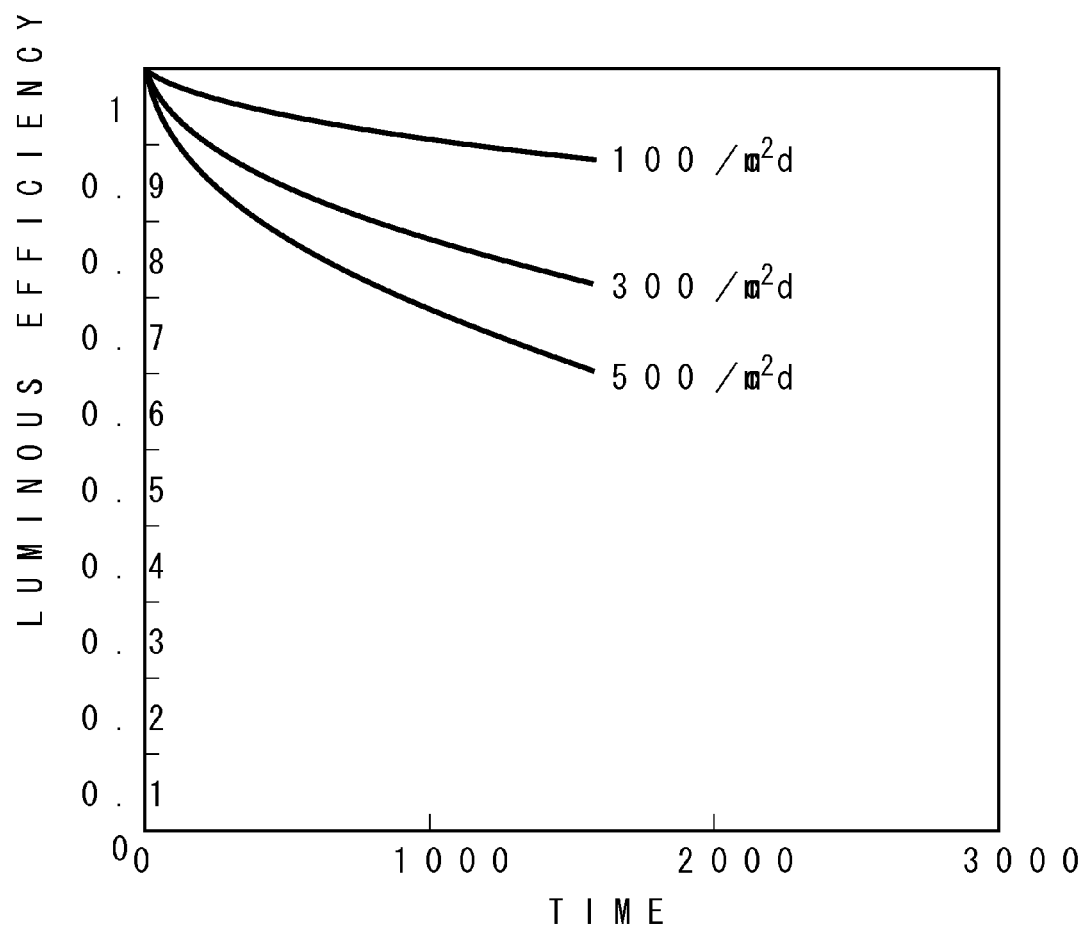
FIG. 2 illustrates the degradation of luminance of organic EL elements.

FIG. 2 illustrates a result of measurement of time change of the luminance when the entire screen of the organic EL display apparatus is displayed by white display. The vertical axis indicates luminance normalized by initial luminance, and the horizontal axis indicates elapsed time. Three areas having the initial luminance of 100 cd/m², 300 cd/m² and 500 cd/m² respectively were formed in the same display apparatus, so that comparison therebetween was performed. Electric current flowing through each light-emitting element increased in proportion to the initial luminance. FIG. 2 shows that as the electric current is greater, the degradation of the luminance proceeds faster. Since the area of the light-emitting face does not change if the electric current is varied, it is understood that the degradation of the luminance proceeds faster as the electric current per unit light-emitting area, in other words, the current density increases.

When the white screen is displayed, to the organic EL elements of each color of red, green, and blue, a largest luminance signal is applied, and largest current flows, and the organic EL elements emit light at highest luminance. However, the luminance of red, green, and blue is not the same luminance, but the ratio of the luminance is adjusted such that the screen is seen in natural white to human eyes. The adjustment is referred to as white balance. White defined by the standard by the Commission Internationale de l'Éclairage (CIE) is the point of (x, y)=(0.313, 0.329) on the chromaticity coordinate.

Meanwhile, the organic EL elements used in the exemplary embodiment of the present invention had a chromaticity of red of $$(x_R, y_R) = (0.65, 0.35)$$

a chromaticity of green of $$(x_G, y_G) = (0.28, 0.61), \text{ and}$$

a chromaticity of blue of $$(x_B, y_B) = (0.14, 0.13).$$

Accordingly, in order to display the white complying with the above-described CIE standard by combining the luminance, it is may be necessary to adjust the luminance ratio of red, green, and blue approximately to, $$L_R : L_G : L_B = 27:55:18.$$

Moreover, the luminous efficiency of each of the organic EL elements of red, green, and blue used in the embodiment of the present invention was, $$\eta_R = 18 \text{ cd/A}$$

$$\eta_G = 18 \text{ cd/A}$$

$$\eta_B = 2.9 \text{ cd/A}.$$

If the organic EL elements emit light with the above-described luminous ratio, a ratio of the electric current flowing through each light-emitting element is, $$I_R : I_G : I_B = 1:2:4.$$

In a display apparatus that has the same aperture ratios of red, green, and blue, the ratio of the current densities also becomes the same ratio.

In the organic EL elements used in the example, a current of the largest current density flows through the organic EL elements that emit blue light, so that it is expected that the degradation of the luminance of blue proceeds faster as compared to the other colors.

If an organic EL element in which luminous efficiency of blue is equal to luminous efficiency of red and green is used, the electric current of green becomes the largest. In a display apparatus that has the same aperture ratio of red, green, and blue, the current density of green becomes the highest, and the degradation speed of the luminance becomes the fastest.

As described below, values of flowing current in a light-emitting element of a color whose luminous degradation speed becomes the fastest speed contained in a pixel group forming a fixed image such as a character or a graphic, and in a light-emitting element of the same color contained in a pixel group forming a background is set to close values, so that burn-in may not be recognized even if luminous degradation occurs.

In the following, a first exemplary embodiment of the invention is described in detail. FIG. 3 illustrates a screen of a display unit 20 of a digital camera that uses a display apparatus according to a first exemplary embodiment of the present invention.

The display unit 20 of the digital camera displays an image of an object captured by a lens or an image already captured and stored in a memory. Further, the display unit 20 is provided with a menu screen for displaying shooting time or for setting shooting conditions. The user of the camera operates the camera and displays the menu screen as needed. On the menu screen, not only characters, but also graphics, patterns, or images of mixture of those can be displayed.

On the menu screen in FIG. 3, characters 21 of "DATE AND TIME", "PICTURE STYLE", "COLOR SPACE", "WHITE BALANCE", and "CAMERA SETTING" on the left side are names of items to be set. On the screen, the characters 21 are fixed still images. On the other hand, the characters 21 of "06/11/03 09:30", "STANDARD", "sRGB", "AUTOMATIC", and "AUTOMATIC" on the right side are values of each item or choices. If time passes or the user changes the setting, corresponding values or characters change. While the menu screen is displayed, most of the time not only the item names on the left side, but also the values (in the case of time, the part of the time in the time and the minutes) and the characters on the right side are fixed.

The menu screen in FIG. 3 is a screen on which the white characters 21 are displayed with a dark background 22. The images such as the characters and graphics are displayed emphasizing white such that the viewability of the images is not lost even in the light. For the purpose, pixels that form the characters, emit light in all of the three colors of RGB at highest luminance. Further, pixels that form the background are driven in at least one color by electric current smaller than the character part. The characters or graphics on the menu screen are still images. Different constant currents continue to flow for long period of time through the pixels of the character part and the pixels of the background. Thus, between the pixels of the characters and the pixels of background, the rates of process of luminance degradation differ from each other. In the light-emitting elements that form the white characters 21, the luminance degradation proceeds faster than that in the light-emitting elements that form the dark background 22. Accordingly, the menu screen is most likely to generate burn-in in display screens in the digital camera.

Figure 4:
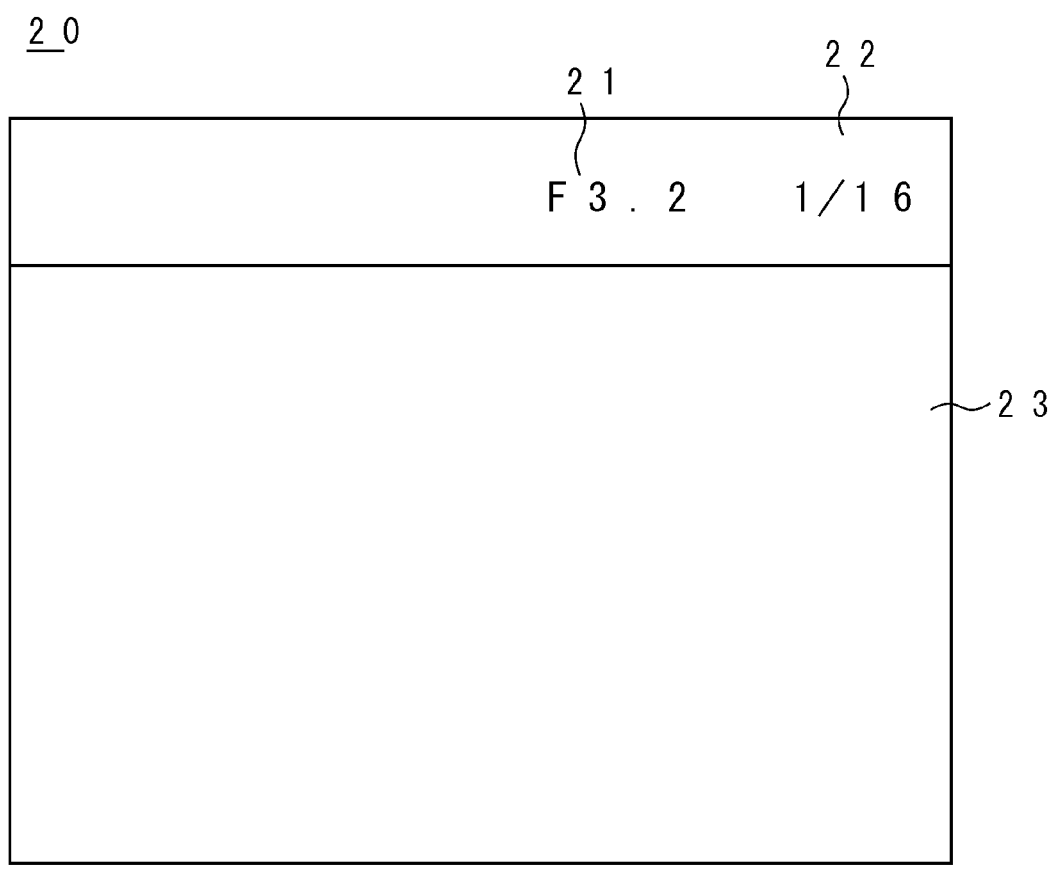
FIG. 4 illustrates another monitor screen of the digital camera in which the display apparatus according to the first exemplary embodiment of the present invention is used.

FIG. 4 is another screen of the display unit 20. On an upper part of the screen displaying a captured image 23, the characters 21 that indicate an aperture value and a shutter speed are displayed in white in the dark background 22. As shown in this case, when the static images such as the characters or a graphic are displayed fixed in a part of the display screen where the image captured by a camera is displayed, the part of the white image is likely to cause burn-in.

In the display apparatus according to the exemplary embodiment of the present invention, the display unit 20 displays the background 22 with blue when the fixed characters 21 or a graphic are composed of the pixels arranged in a certain place, and the characters or the graphic are displayed as white still images.

Figure 5:
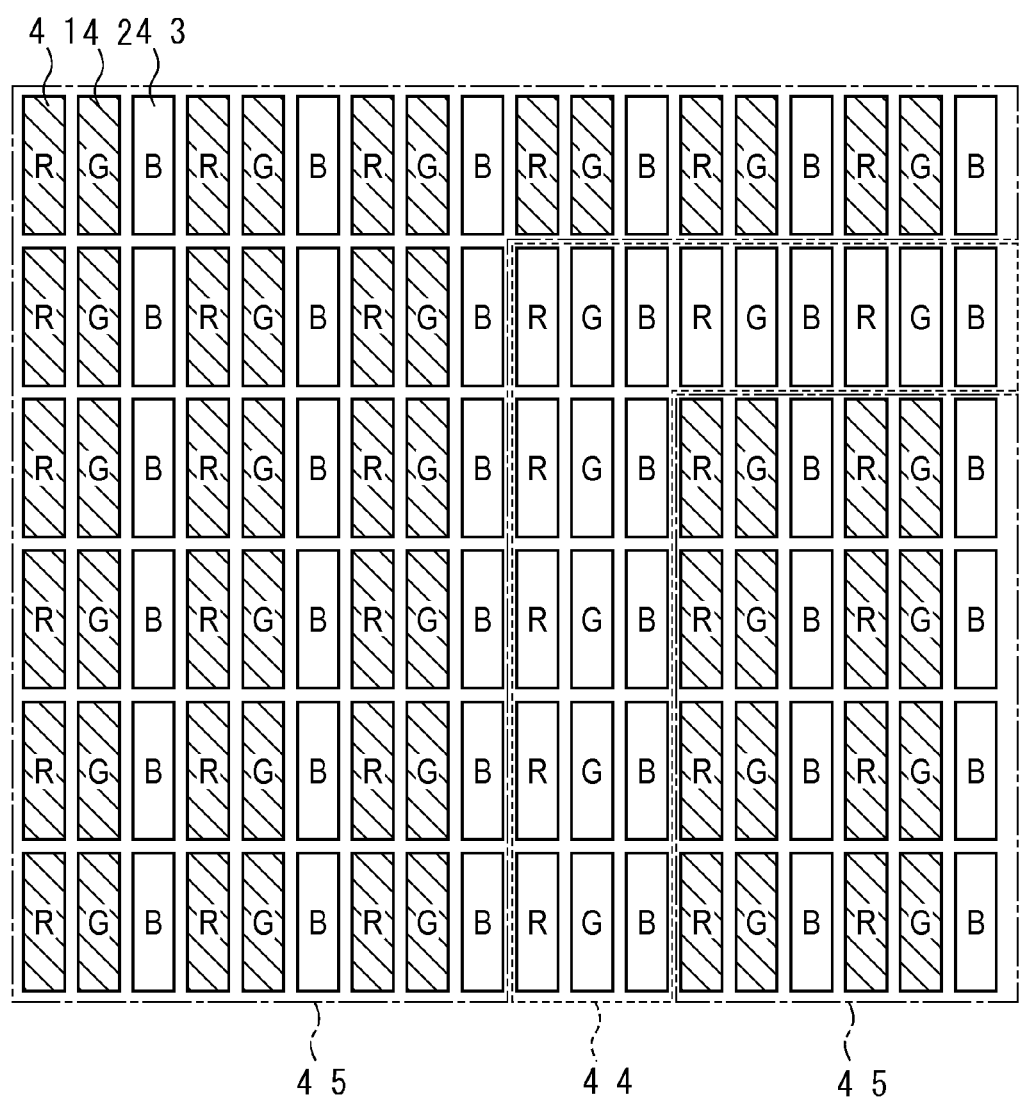
FIG. 5 is an enlarged view of a part of the monitor screen in FIG. 3.

FIG. 5 is an enlarged view of a part 24 of the menu screen in FIG. 3. The display unit 20 is configured with a matrix display apparatus in which the three organic EL elements 41, 42, and 43 formed by R (red), G (green), and B (blue) respectively configure one pixel, and the pixels are regularly arranged. In the exemplary embodiment, the area of each of the light-emitting faces of R, G, and B is equal to each other, and its aperture ratio is also equal to each other.

An area 44 surrounded by dashed lines is a part of the white character 21. All of the organic EL elements 41 to 43 (referred to as a first light-emitting element group) of red, green, and blue contained in the character area emit light by electric current corresponding to a highest luminance signal. An area 45 surrounded by a dashed-dotted line of the periphery of the character area 44 forms the background 22 of blue. In the light-emitting elements (referred to as a second light-emitting element group) included in the background area 45, only the blue organic EL elements 43 emit light, and the red organic EL elements 41 and the green organic EL elements 42 are in a non-lit state.

For the color of the background area 45, out of the light-emitting elements of red, green, and blue in the character area 44, the color of a light-emitting element that has the largest current density is selected. If the current density of the light-emitting element 43 of blue in the character area 44 is the largest current density, blue is selected as the background color.

Figure 6:
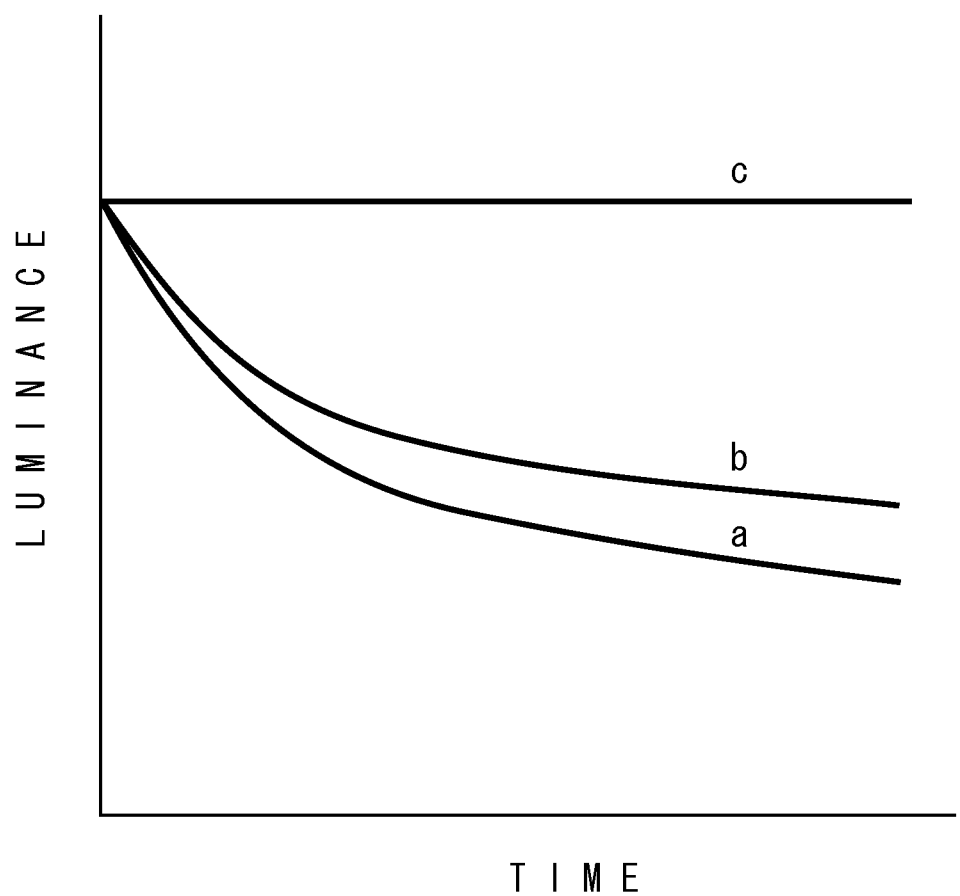
FIG. 6 illustrates the degradation of luminance in a character area and background areas.

FIG. 6 illustrates time change of luminance measured by displaying a white character (all of R, G, and B are lit at highest luminance) with a blue background (only B is lit) and a black background (all of R, G, and B were not lit) for long period of time, at some point of time, changing the entire screen into white, and measuring luminance of three areas of (a) character area 44, (b) blue background area 45, and (c) black background area.

The luminance in the character area 44 of (a) degrades as time advances. In the black background area of (c), the degradation in luminance does not occur. Accordingly, the initial luminance is kept when time has elapsed. In the black background area of (c), as compared to the character area 44 of (a), a large difference is generated in the luminance of blue. Accordingly, if the screen is switched to another screen, red and green emits light at substantially the same luminance as the initial luminance but the brightness of blue in the area of (a) is low, so that the two areas of (a) and (c) look like different colors.

In the blue background area 45 of (b), the luminance degradation of the light-emitting element of blue progresses at the same speed as the speed of the white image area of (a). On the other hand, in the light-emitting elements of red and green, luminance degradation does not occur. Accordingly, the luminance becomes the intermediate luminance between (a) and (c). However, the luminance degradation of the light-emitting elements of red and green progresses slowly as compared to the light-emitting elements of blue. As a result, even if the luminance degradation of blue in the background area 45 progresses, the luminance in the character area (a) of red and green changes little from the initial luminance. Accordingly, the white display luminance in the blue background area 45 of (b) becomes close to the white display luminance in the character area 44 of (a). As a result, in each of the light-emitting elements of R, G, and B, the luminance difference between the character area 44 and the background area 45 is small, and if the screen is switched to another screen, the burn-in is unnoticeable.

If red or green instead of blue, is set as the background color, the luminance of red or green in the background area 45 degrades a little, however, blue does not generate luminance degradation. As a result, if the background area 45 is displayed in white, the luminance becomes close to that in (c) in FIG. 6, and then, the luminance largely differs from that in (a). In such a case, burn-in is noticeable. In the exemplary embodiment of the present invention, the background color is set to blue whose current density is largest among three colors, in other words, the luminance degradation speed is the fastest, so that both of the luminance of blue in the background area 45 and the luminance of blue in the character area 44 degrades, and as a result, the burn-in becomes unnoticeable.

The luminance of blue in the background area 45 is not always the same as that of blue in the character area 44 that are lit at the highest luminance. The ratio of the electric current in the background area 45 to that in the character area 44 can be set to a ratio smaller than one, and the background can be displayed at luminance lower than that in the characters. In such a case, luminance degradation of blue in the background progresses slower than that of blue in the characters. However, as long as the difference is small and the difference is not visually recognized as burn-in, the process is feasible. For the similar reason, red and green in the background can be lit at low luminance.

In each case, the ratio of the electric current $I_a$ flowing through each light-emitting element in the white character area 44 and the electric current $I_b$ flowing through each light-emitting element in the background area 45 is, in the case of blue, closest to 1, and in the case of red and green, the ratios are smaller than in the case of blue. Specifically, $$(I_{b,R}/I_{a,R})<(I_{b,B}/I_{a,B})<1,$$

$$(I_{b,G}/I_{a,G})<(I_{b,B}/I_{a,B})<1.$$

By the setting, the luminance degradation in the two areas of 44 and 45 can proceed at similar speeds, and as a result, burn-in can be unnoticeable.

Figure 7:
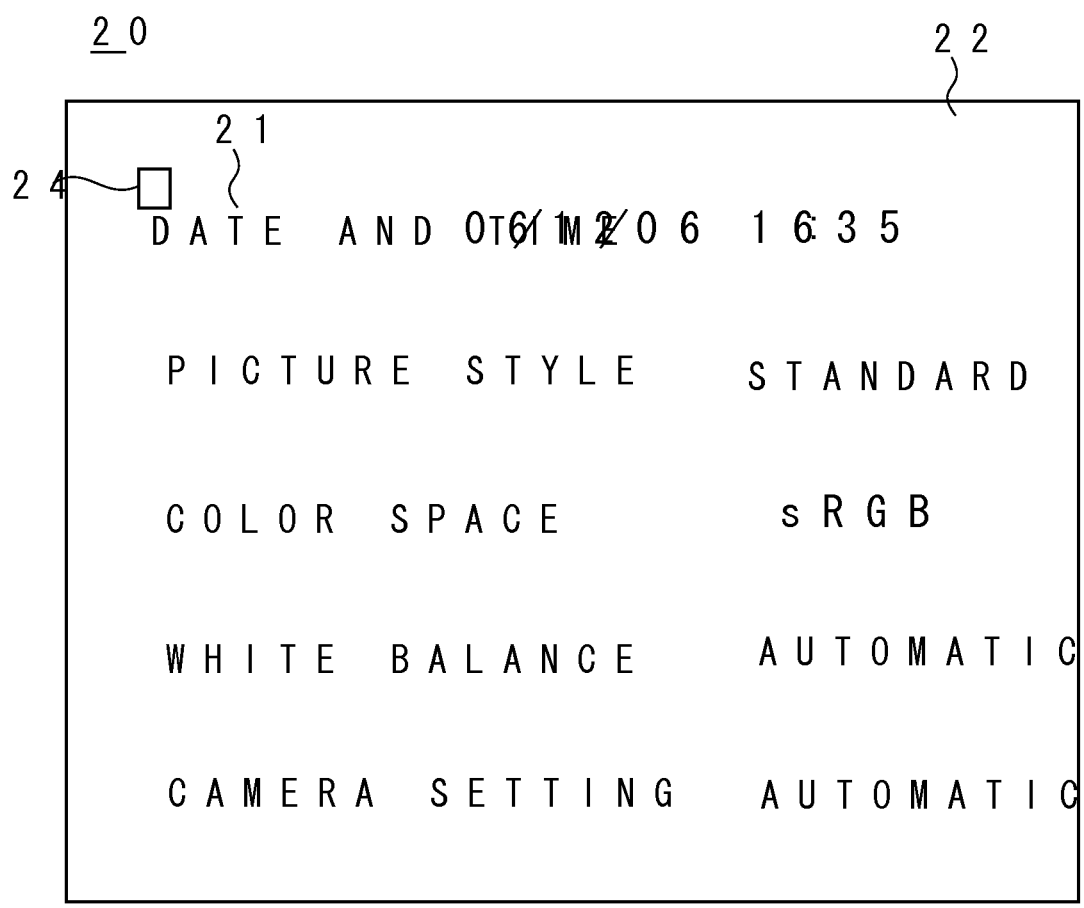
FIG. 7 illustrates a monitor screen of a digital camera in which a display apparatus according to a second exemplary embodiment of the present invention is used.

In the following, a second exemplary embodiment of the invention is described in detail. FIG. 7 illustrates a state that the display unit 20 of the digital camera displays, as a menu screen, the characters 21 in black and the background 22 brighter than the characters 21. By displaying the characters in black, the contrast with the background is kept at a high level, and then, viewability is not deteriorated even in bright light. The other parts are similar to those in the first exemplary embodiment. The display part 20 includes the organic EL elements 41, 42, and 43 forming the three colors of R, G, and B, and if white at maximum luminance is displayed, a current density of the light-emitting elements 43 of blue is the largest among the three colors.

Figure 8:
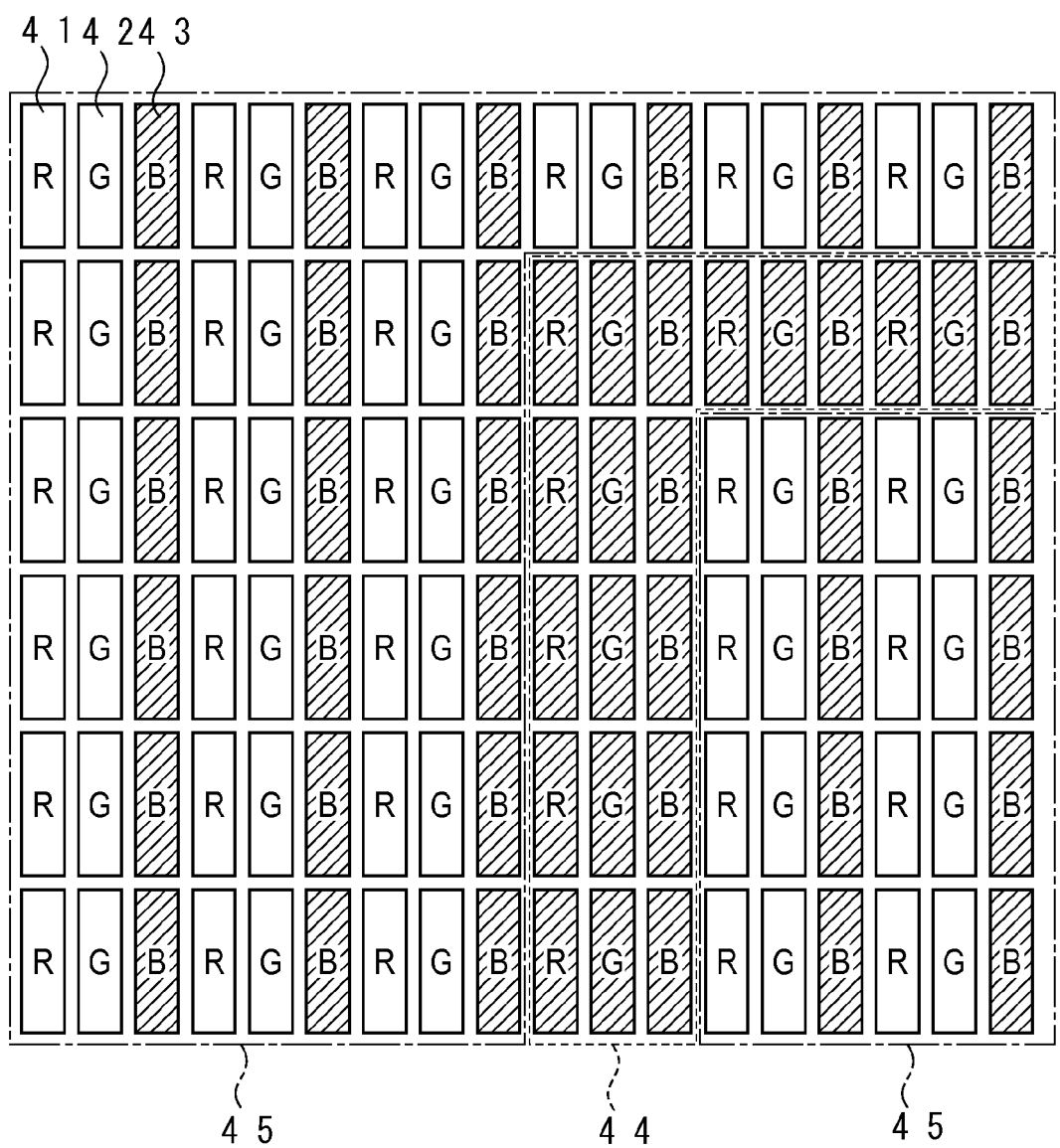
FIG. 8 is an enlarged view of a part of the monitor screen in FIG. 7.

FIG. 8 is an enlarged view of the part 24 of the menu screen in FIG. 7. In the black character area 44, all of the organic EL elements 41 to 43 of red, green, and blue are not lit, and in the background area 45, the organic EL elements 41 and 42 of red and green are lit at maximum luminance, and the organic EL elements 43 of blue are not lit.

In the display apparatus according to the exemplary embodiment, it is assumed that in the bright background area 45, the still character area 44 having luminance lower than the background exists in a certain shape. In the background area 45, light of a color whose current density is largest when white is displayed, in other words, a color (blue in the exemplary embodiment) that has the fastest luminance degradation speed, is turned off, and the background is displayed using the other light-emitting elements of red and green. In the light-emitting element 43 of blue whose luminance degradation speed is the fastest among three colors, luminance degradation does not occur both in the character area 44 and the background area 45. The luminance of the light-emitting elements 41 and 42 of red and green degrades a little in the background area 45, however, the degradation is small. As a result, burn-in is rarely generated.

The luminance of the light-emitting elements 41 and 42 of red and green in the background area 45 can be lowered to luminance lower than the maximum luminance. Further, the light-emitting elements 43 of blue in the background area 45 can be lit at low luminance without turning off the light-emitting elements 43. In such a case, if the color that emits light at the largest current density is blue, the background becomes gray in which blue is weak, and red and green is strong, in other words, yellowish gray. In the black character area 44, the luminance degradation of blue does not occur, and the luminance degradation of blue in the bright background area 45 is small. As a result, also burn-in is unnoticeable. The luminance of the total of the three colors in the background area 45 degrades as compared to the case of the white background. However, the pixels that display the characters or an image remain black. Accordingly, the viewability does not change so much.

In each case, the ratio of the electric current flowing through the light-emitting elements 43 of blue in the background area 45 to the electric current flowing through the light-emitting element 43 of blue in the character area 44 is set to a ratio closer to 1 than the ratios of the electric current of the other colors. Specifically, $$1<(I_{b,B}/I_{a,B})<(I_{b,R}/I_{a,R}),$$

$$1<(I_{b,B}/I_{a,B})<(I_{b,G}/I_{a,G}).$$

In the case of the exemplary embodiment, contrary to the first exemplary embodiment, the luminance in the character area 44 is low. As a result, as shown in the above expression, the ratios of the electric current (the ratio of the electric current in the background area to the electric current in the character area) of each color become ratios larger than 1. However, the second exemplary embodiment is similar to the first exemplary embodiment with respect that the ratios of the electric current of blue are set to ratios closer to 1 than the ratios of the electric current of the other colors.

In the following, a third exemplary embodiment of the invention is described in detail. By increasing an aperture ratio to be larger than other colors, the current density is decreased. Then, by changing the aperture ratio, the magnitude relation of the current density is reversed. In such a case, the fact remains that the luminance degradation progresses at the fastest speed in a color having the largest current density. Accordingly, in a case of a display apparatus that has different aperture ratios of R, G, and B, by selecting a color having the largest current density in white display, and setting the ratio of the electric current in an image area and in a background area of the color to a ratio closer to 1 than that of the other colors, burn-in becomes unnoticeable.

In a case where the aperture ratios of R, G, and B are 20%, 20%, and 40% respectively, to perform white balance, if the ratio of the electric current is set to $I_R:I_G:I_B=1:2:4$, the ratio of the current density becomes $i_R:i_G:i_B=1:2:1$. Then, the current density of the light-emitting element of green has the largest value, and the luminance degradation progresses at the fastest speed. In such a case, by displaying characters in white and displaying a background in green, burn-in becomes unnoticeable.

If the character area 44 is to be displayed in white and the background area 45 is to be displayed in red, the aperture ratio of red is set to a value smaller than those of green and blue to increase the current density of red to a current density higher than those of green and blue. By this setting, the ratio of the electric current of red can be set to a ratio closest to 1, in other words, the background can be displayed in red.

In the second exemplary embodiment, if the character area 44 is to be displayed in black and the background area 45 is to be displayed in blue, the aperture ratio of blue is set to a value larger than those of red and green to decrease the current density of blue to a current density lower than those of red and green. By this setting, the current density of red or green becomes the largest in white display. Then, in the background area 45, those colors are not lit, but blue can be lit.

Characters or graphics such as icons, or pointers can be displayed as still images not only on the menu screen of the digital camera. Aspects of the present invention can be applied to all cases where for example, standby screens of cell-phones, or television screens for always displaying a channel at apart near a corner, an image such as a character and a graphic are displayed at a certain place on a display screen and in a certain shape as a still image for long period of time.

Aspects of the present invention can be applied to not only the organic EL elements, but also to light-emitting elements that emit light at luminance corresponding to electric current such as light emitting-diodes (LED), semiconductor lasers, or the like.

Hereinafter, aspects of the present invention is specifically described with reference to the exemplary embodiments.

The first exemplary embodiment of the present invention is applied to the monitor display of the digital camera, and the display unit displays the screens illustrated in FIGS. 3 and 4. To each of the organic EL elements of R, G, and B in the white character part, electric current corresponding to each largest signal is supplied respectively. On the background, red and green are not lit, and to the organic EL elements of blue, the same electric current as the electric current in the white character part is supplied. The ratio of the electric current in the background part to the character part is 0 in the light-emitting elements of red and green, and 1 in the light-emitting elements of blue.

The electric current is maintained, and the light-emitting elements continuously emit light for a long period of time. In the state, each time a predetermined period of time passes, to both of the blue organic EL elements of the character part and the background, a largest signal current is supplied to display the entire screen in blue, and the luminance in the part where the characters are displayed and the part where the background is displayed is measured respectively. As time advances, the luminance in the character part becomes lower than that in the background part. When the difference exceeds a certain value, the difference can be visually recognized as burn-in. The elapsed time until the burn-in can be visually recognized was examined.

If it is assumed that luminance L after elapsed time T (time) decays exponentially with the time, it is generally expressed as follows:

$L=L_0\exp(-kT)$, where $L_0$ is initial luminance and $k(1/$hour$)$ is attenuation factor.

As shown in FIG. 2, the larger the initial luminance or the drive current, the faster the degradation of the luminance. After checking in detail, k was substantially proportional to the current density, and when the initial luminance was 400 cd/m$^2$, then, $k=7.54\times10^{-5}$/hour ($1/k=13300$ hours).

Given the initial luminance of the blue organic EL elements in the character part is $L_{a0}$ and the luminance after time T is $L_a$, and the initial luminance of the blue organic EL elements in the background is $L_{b0}$ and the luminance after time T is $L_b$, then, $L_a=L_{a0}\exp(-kT)$, $L_b=L_{b0}\exp(-(L_{b0}/L_{a0})kT)$. At this point, if the entire screen is displayed with a signal of the highest luminance of blue, since the character part has been driven by the largest electric current, the luminance is the same, however, in the blue organic EL elements that displayed the background, the current density is multiplied by $L_{a0}/L_{b0}$, and the luminance is also multiplied by the same rate, and then, $L_b'=L_{a0}\exp(-(L_{b0}/L_{a0})kT)$.

The difference of the luminance of blue between the character part and the background is, $(L_b'-L_a)/L_b'=1-\exp((L_{b0}/L_{z0}-1)kT)$.

It is said that if the difference in the luminance exceeds 2.4%, burn-in becomes visible. Accordingly, the time T when the value according to the expression becomes 0.0024 is the burn-in time. FIG. 9 shows a result of plotting the time until the difference in luminance became 2.4%, against the luminance ratio $L_{b0}/L_{a0}$ (equal to the ratio of the electric current) of the initial character part and the background. If the ratio of the electric current is close to 1, time until burn-in becomes visible, in other words, the lifetime as the display apparatus is dramatically prolonged.

Setting the background to black corresponds to the case where the ratio of the electric current is 0. In such a case, the burn-in time is 315 hours. As compared to this case, to prolong the lifetime (time until burn-in is generated) of the organic EL panel with a blue background to 3150 hours, or 10 times longer than the above described case, the ratio of the electric current between the blue character part and the background part can be set to 0.9 or a value larger than 0.9 and closer to 1.

In the second exemplary embodiment, in the monitor display of the digital camera, the menu screen illustrated in FIG. 7, or the like is employed. The characters 21 are displayed in black, and in the background 22, the organic EL elements 43 of blue are not lit, and only the organic EL elements 42 of green and the organic EL elements 41 of red are lit.

The electric current in each light-emitting element in the character 21 is zero. However, if it is assumed that, for descriptive purposes, $I_{0,R}$, $I_{0,G}$, and $I_{0,B}$ are minute values of not zero, the ratios of electric current in the background part to that in the character part of the each of the organic EL elements 41 to 43 of R, G, and B are equal to 1 in B, and larger than 1 in red and green.

Since the same organic EL elements 41 to 43 as those in the first exemplary embodiment are used, when a white image is displayed, luminance of blue degrades at the fastest speed. If blue in the background is not lit similarly to that in the character part, and only red and green are lit, the degradation of luminance in the background progresses little, and burn-in does not occur even if the organic EL elements are driven for long period of time similarly to the first exemplary embodiment.

The blue in the background can be weakly lit. However, the ratio of the electric current of the blue character to the background, $I_{b,B}/I_{a,B}$, is set to a value smaller than both of the ratio of the electric current of red and the ratio of the electric current of green. In the current case, the ratio of the electric current is a value larger than 1. Accordingly, the ratio of the electric current of blue is closer to 1 than the ratios of the electric current of red and green. If blue is lit in the background area, the luminance degrades in blue in the background area. However, if the luminance is kept to a value sufficiently low, the process progresses slowly. Then, the luminance difference between blue in the background area and blue in the character area is very small. Accordingly, it takes a long time until burn-in is generated, and the lifetime as the display apparatus can be maintained.

Depending on display apparatuses, for the background color, blue may be used. In such a case, an aperture ratio is changed such that an aperture ratio of blue is large, an aperture ratio of green is small, and light-emitting elements having a largest current density are green. In this case, green has the fastest luminance degradation speed, and then, it is possible to turn off green light and turn on blue light in the background.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-113433 filed May 17, 2010, which is hereby incorporated by reference herein in its entirety.

What is claimed is:

1. A method of display on a display apparatus including a display unit in which a plurality of light-emitting elements emitting light corresponding to flowing current are arranged, the plurality of light-emitting elements including light-emitting elements of different colors each of which emits light at the maximum luminance to display white, wherein electric current densities per unit light-emitting area of the light-emitting elements of different colors to display white are mutually different, the method comprising:

providing electric current to a first light-emitting element group which includes the light-emitting elements of the different colors and forms a character or a graphic in a certain position in the display unit; and providing electric current to a second light-emitting element group which includes the light-emitting elements of the different colors same as the first light-emitting element group and forms a background of the character or the graphic in a position surrounding the first light-emitting element group;

wherein, during providing of electric current to the first and second light-emitting groups to form the character or the graphic and the background, respectively, a ratio for the light-emitting elements of the color having the largest electric current density to display white is closer to 1 than a ratio for light-emitting elements of the other colors, with respect to the ratio of the electric current flowing through the light-emitting elements in the second light-emitting element group to the electric current flowing through the light-emitting elements in the first light-emitting element group.

2. The method according to claim 1, wherein
the light-emitting elements in the first light-emitting element group display white, and
the light-emitting elements in the second light-emitting element group display a color of the light-emitting elements having the largest electric current density.

3. The method according to claim 1, wherein,
the light-emitting elements of the first light-emitting element group display black, and
the light-emitting elements in the second light-emitting element group display a color of the light-emitting elements other than the light-emitting elements having the largest electric current density to display white.

4. The method according to claim 1, wherein an aperture ratio of the light-emitting elements of the color having the largest electric current density to display white is smaller than an aperture ratio of the light-emitting elements of the other colors.

5. The method according to claim 1, wherein the areas and aperture ratios of the light-emitting elements of different colors are equal to each other.

* * * * *